United States Patent [19]

Gallagher et al.

[11] Patent Number: 5,302,831
[45] Date of Patent: Apr. 12, 1994

[54] DEWAR CONSTRUCTION FOR COOLING RADIATION DETECTOR COLD FINGER

[75] Inventors: Brian W. Gallagher, Highland Lakes; Duncan R. Quinn, Ridgewood, both of N.J.

[73] Assignee: North American Philips Corporation, New York, N.Y.

[21] Appl. No.: 876,848

[22] Filed: Apr. 30, 1992

[51] Int. Cl.⁵ .................................... H01J 37/244
[52] U.S. Cl. .................................... 250/397; 250/310; 250/370.15
[58] Field of Search ................. 250/310, 370.15, 397

[56] References Cited

U.S. PATENT DOCUMENTS

| | | |
|---|---|---|
| 3,732,421 | 5/1973 | Kunimoto et al. |
| 3,864,570 | 2/1975 | Zingaro .................... 250/272 |
| 4,886,240 | 12/1989 | Rich ........................ 250/352 |
| 4,910,399 | 3/1990 | Taira et al. ............... 250/310 |
| 4,931,650 | 6/1990 | Lowe et al. ............... 250/397 |
| 4,952,810 | 8/1990 | Gustafson et al. ....... 250/352 |

FOREIGN PATENT DOCUMENTS

| | | |
|---|---|---|
| 0302716 | 2/1989 | European Pat. Off. ........ G01T 1/24 |
| 4-110690 | 4/1992 | Japan ........................... 250/370.15 |
| 2192091 | 12/1987 | United Kingdom ........ H01J 37/244 |

*Primary Examiner*—Jack I. Berman
*Assistant Examiner*—James Beyer
*Attorney, Agent, or Firm*—William L. Botjer

[57] ABSTRACT

An inner vessel having a truncated triangular volume is spaced from an outer housing of similar shape to form a chamber therebetween. A thermally conductive strap is connected at one end to the vessel at its other end to a cold finger tube extending into the chamber. The vessel contains liquid nitrogen and is secured in spaced relationship from the outer housing by a fiberglass liquid nitrogen fill tube. An electronic assembly for processing signals generated by the detector cooled by the cold finger are aligned with the cold finger external the dewar housing. The dewar accommodates entry port angles between zero and 60° for different microscopes without physical interference with the microscope housing and attachments.

22 Claims, 3 Drawing Sheets

DEWAR CONSTRUCTION FOR COOLING RADIATION DETECTOR COLD FINGER

This invention relates to a Dewar construction for cooling with liquid nitrogen a radiation detector secured to a cold finger for detecting X-ray radiation in an electron microscope.

Dewar constructions for use with radiation detector cold fingers are in wide use. Generally these dewar constructions comprise an elongated circular cylindrical container having a dual wall construction in which the inner wall forms a vessel thermally isolated from the outer wall via a vacuum. The inner vessel is filled with liquid nitrogen and is used for cooling a cold finger of a cold finger assembly.

Typically a cold finger assembly comprises a cold finger tube mounted within an outer warm cap tube. A radiation detector is secured to the cold finger at one end which is inserted as a probe into a cavity of an electron microscope for detecting X-ray radiation emitted by a specimen under observation in response to an incident electron beam emitted by the electron microscope. The nested warm cap tube and cold finger tube, in one prior art embodiment, are attached at the end opposite the detector to a housing in which electronic circuitry is located for operating the detector assembly and, in particular, for receiving electrical signals generated by the radiation detector and for processing those signals. The housing in this embodiment is generally an enlarged unit having a volume sufficient to receive the end of the cold finger assembly, the electronic circuitry, means for securing the dewar thereto and means for securing a slide mechanism thereto. The slide mechanism is secured to the cold finger assembly housing and is attached also to the electron microscope via the port cover into which the cold finger is inserted. The slide mechanism positions the detector adjacent to the specimen under examination inside the microscope cavity. The dewar is attached to an opposing side of the cold finger assembly housing as the is mechanism to cool the cold finger tube. The cold finger tube has a portion which extends into the housing and is thermally conductivly attached to one end of a braided copper strap. The other end of the braided copper strap is thermally conductively secured to the cold inner nitrogen containing vessel of the dewar, for example, at 77° K. The heat from the cold finger is conducted via the strap to the dewar vessel maintaining the cold finger at that cryogenic temperature. The cold finger being thermally isolated from the warm tube cap is at a cryogenic temperature for cooling the detector at the opposite end inside the electron microscope.

Various electron microscopes have different entry angles for receiving the cold finger assembly. In some configurations, the end of the warm cap tube has a window for receiving the X-ray radiation from the specimen. In other configurations, the detector is exposed directly to the X-ray radiation of the specimen and is referred to as windowless operation. Once the warm cap tube is in place in the electron microscope it is hermetically sealed to the microscope via a port cover over the microscope cavity. Because the cold finger assembly is relatively long and is inserted into the cavity via the port cover of the electron microscope, the orientation of the cold finger assembly is determined by the entrance port of the electron microscope cavity. In some cases this entrance port extends horizontal. In other cases it may have an angle relative to the horizontal of as much as 60°. These angles are referred to as entrance angles.

Where the entrance angle is horizontal, the dewar is attached directly to the cold finger assembly housing and has its axial direction normal to the axial direction of the cold finger tubes. Where the entrance angle is non-horizontal, for example, as much as 60° with the horizontal, a wedge member is secured between the dewar and the cold finger assembly housing in the embodiment described above so as to permit the dewar to be secured vertically with respect to gravity regardless the entrance angle of the microscope port cover. Because of these relative configurations, the point at which the cold strap is secured to the dewar inner vessel containing the nitrogen at one end and the other end of the strap connected to the cold finger is a relatively long heat path. As a result, a number of different sources of heat input may be received by the strap so as to reduce the efficiency of the system causing excess boiling off of nitrogen in order to maintain the desired cryogenic temperature. Further, the addition of the wedge member to orient the dewar adds additional cost to the system. The excessive use of nitrogen and the additional components in this assembly are costly. The wedge member is needed because if the dewar were mounted directly to the housing without the wedge member the dewar would, due to various entrance angles of the cold finger assembly, interfere with the structure of the microscope and could not be mounted. Therefore, the wedge member keeps the dewar spaced from the protruding portions of the microscope housing.

The present invention is a recognition of the above problems and of a need to provide more effective coupling of the dewar to the cold finger and with the use of less components to reduce the cost of the system. The present invention is a further recognition of a need for a more universal dewar construction which can be used with a variety of microscopes of different entrance port angles and protuberances without the use of additional wedges.

A dewar construction for cooling a radiation detector cold finger of a cold finger assembly for use with an electron microscope in accordance with one embodiment of the present invention comprises a housing and a vessel secured thermally insulated from and within the housing for receiving liquid nitrogen for cooling the cold finger. The vessel is spaced from the housing to form a chamber therebetween. The chamber is adapted for maintaining a vacuum. Means releaseably secure the cold finger assembly to the housing in a given fixed orientation relative to the vessel with a portion of a secured cold finger extending into the chamber adjacent to the vessel.

In accordance with a further embodiment the dewar construction includes means for securing the cold finger assembly to the housing in a given fixed orientation relative to the vessel such that the orientation of the vessel and cold finger relative to the horizontal is determined by the entrance aperture angle. Means receive a thermally conductive cold finger cooling conductor secured thermally conductivly to the vessel at a region of the vessel in the chamber such that the received liquid nitrogen is substantially in thermal conductive relation with the region regardless the orientation of the Dewar with respect to the horizontal.

In a further embodiment, the housing includes means for receiving electrical circuitry for operating the cold finger assembly located adjacent to the means for securing the cold finger and external the chamber.

In accordance with a still further embodiment, the Dewar housing and vessel comprise nested substantially truncated solid triangular volumes in at least one plane.

IN THE DRAWINGS

DESCRIPTION OF THE PREFERRED EMBODIMENT

Figure 1:
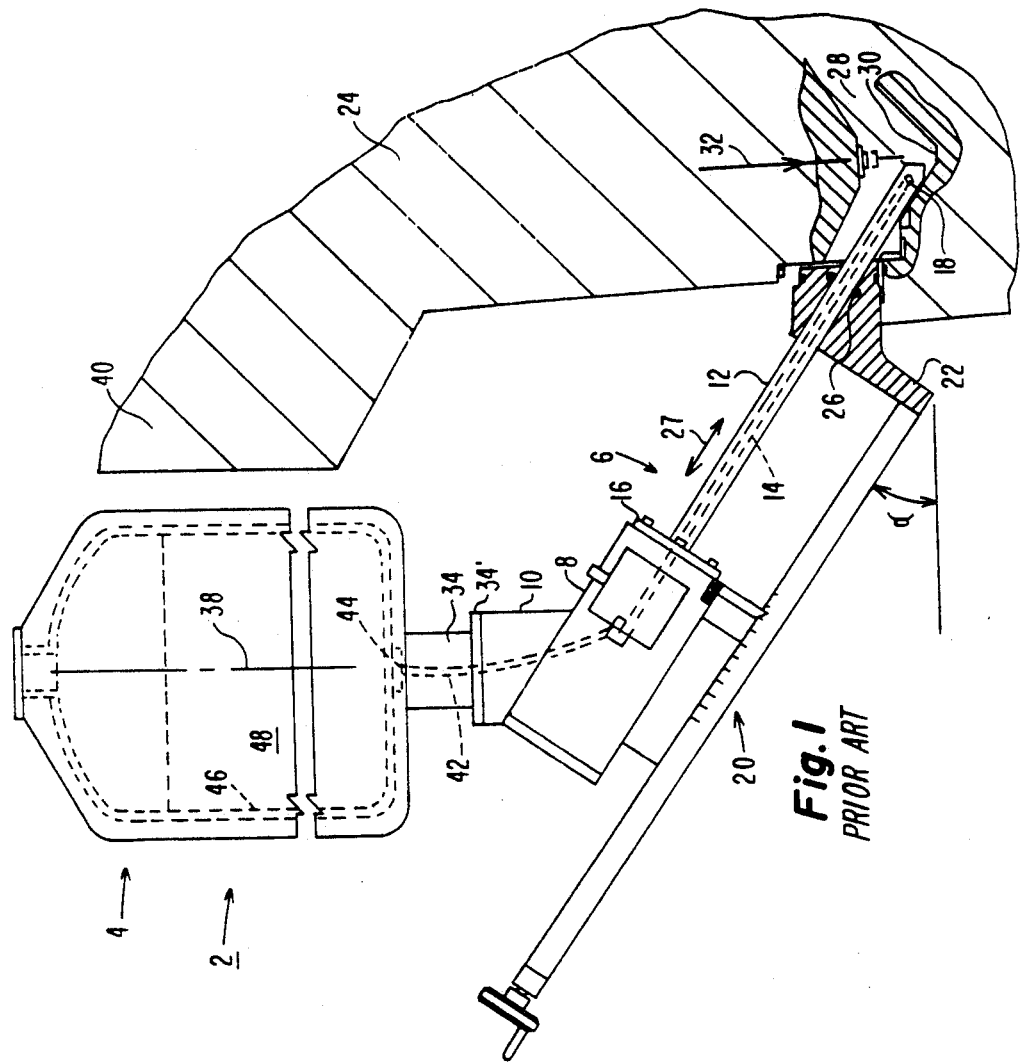
FIG. 1 is a side elevation view partially fragmented illustrating a prior art Dewar construction and cold finger assembly for use with an electron microscope.

In FIG. 1, an embodiment of a representative prior art Dewar and cold finger assembly system 2 as described in the introductory portion is illustrated. System 2 comprises a Dewar 4 of prior art construction secured to a cold finger assembly 6 housing 8 via wedge 10.

The cold finger assembly 6 comprises a warm cap tube 12 and a cold finger 14 thermally decoupled from the warm cap tube 12 and nested within the tube 12 and attached to housing 8. The warm cap tube 12 is secured to housing 8 by a flange 16. A radiation detector 18 is secured to the cold finger tube 14 at the extended end of the assembly 6 A slide mechanism 20 is secured to the housing 8 and is also secured to a port cover 22 of electron microscope 24 for securing the assembly 6 to the microscope. The assembly 6 is secured to the port cover 22 via O ring 26 for slideably sealingly engagement for displacement in directions 27. The assembly 6 is inserted in cavity 28 of microscope 24 for detecting X-ray radiation emitted by specimen 30 in response to an incident beam 32 of electrons emitted by the microscope 24.

The slide mechanism 20 is secured to the underside of housing 8 whereas the wedge 10 is secured to the top side of the housing 8 relative to gravity. The wedge 10 secures the neck 34 of the dewar 4 to the housing 8. The wedge 10 secures the cylindrical axis 38 of the dewar 4 vertically with respect to gravity. In addition, the wedge 10 positions the dewar 4 so as to not interfere with a portion of protruding elements 40 of the microscope 24. As is evident from FIG. 1 without the wedge 10, the axis 38 would be tilted toward the microscope 24 and the dewar 4 could not be mounted in this orientation because of interference with the protruding portion 40.

In the embodiment illustrated in FIG. 1, the microscope 24 is one in which the entrance angle α of the cold finger assembly 6 is for example about 30°. This angle may be anywhere in the range of 0° to 60° for a given microscope. The wedge 10 is one of a set of wedges for orienting the axis 38 of the dewar 4 vertically in connection with a given microscope entrance angle. In those cases where the entrance angle α is 0°, the assembly 6 is horizontal and the wedge 10 is omitted.

The housing 8 provides a cavity for the electronics for operating the detector 18 and related structures. The housing 8 also includes the necessary mechanical structures for securing the dewar thereto either directly via flange 34' secured to the neck 34 or wedge 10 as the case may be. The housing 8 also includes additional mechanical elements for securing the slide mechanism 20 thereto.

The dewar 4 is shown fragmented and, in fact, is relatively long. This length of the dewar 4 tends to further make awkward its use with a cold finger assembly 6 in those microscopes having non-zero entrance angles.

A copper braided thermal conductor strap 42 is connected to a lug 44 thermally conductively secured to the bottom of vessel 46 of the dewar 4. Vessel 46 contains liquid nitrogen for cooling the assembly 6 cold finger 14 via strap 42. The lug 44 is positioned somewhat centrally at the bottom of the vessel 46 and is cooled by the liquid nitrogen in the vessel 46. A cryogenic temperature typically at 77° K. is maintained at lug 44 by the liquid nitrogen. The heat from the cold finger tube 14 is conducted by the strap 42 to the vessel 46 for cooling the cold finger tube 14. However, the path of the strap 42, as is evident in FIG. 1, is relatively long and is lengthened by wedge 10. Further, the additional components formed by housing 8 adds further cost to the system as well as lengthening the heat path between the cold finger tube 14 and the vessel 46 of the dewar 4. The heat input to the strap 42, because of its length, tends to result in excess nitrogen being boiled off within the dewar 4 and adding to the cost of operating the system. A dewar according to the present invention in FIG. 2 provides a universal construction which overcomes the above problems.

Figure 2:
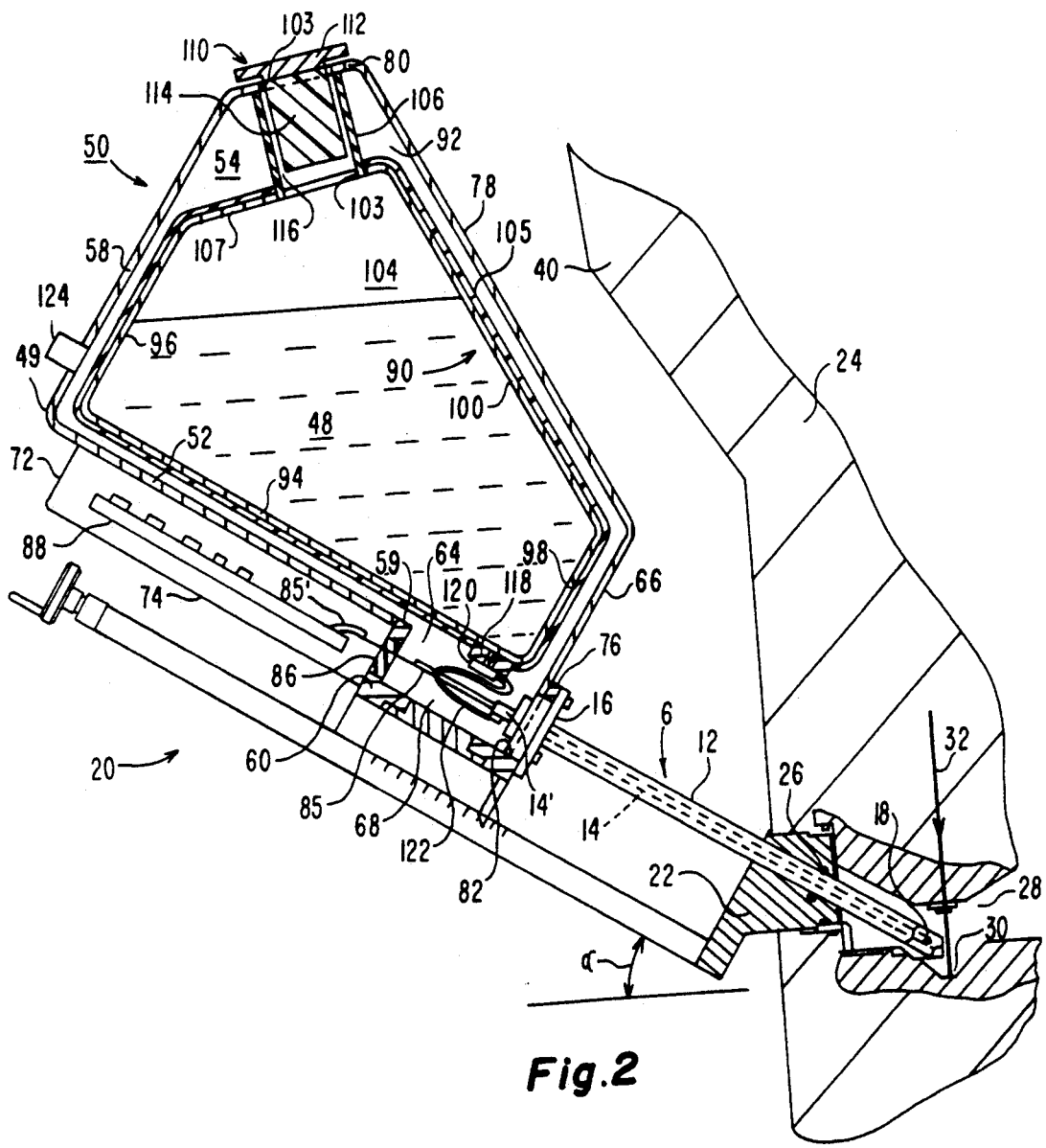
FIG. 2 is a side elevation sectional view of a Dewar construction and cold finger assembly having a orientation similar to that of the system of FIG. 1 in accordance with one embodiment of the present invention.
Figure 3:
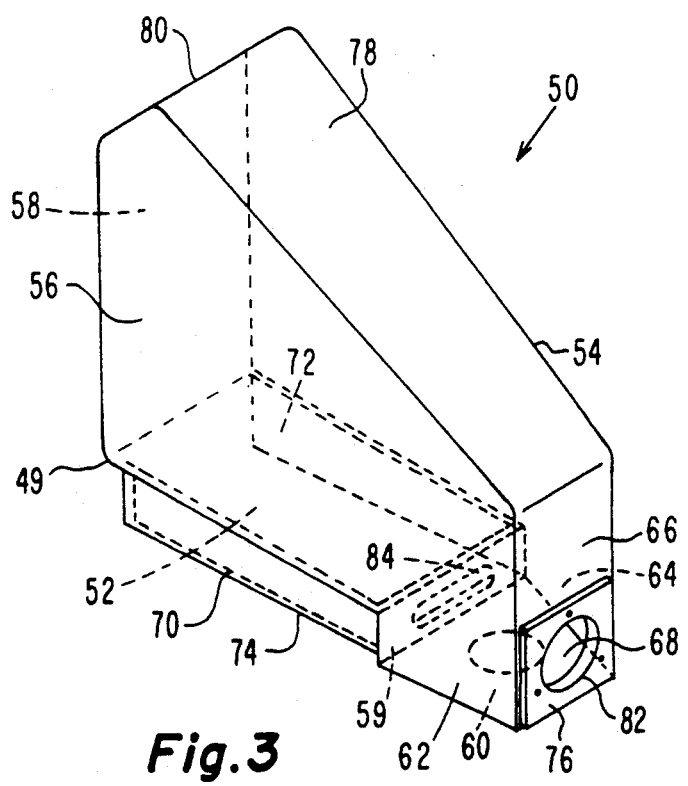
FIG. 3 is an isometric view of the Dewar of FIG. 2 without the cold finger attached thereto.

In FIG. 2, those reference numerals which are the same as those used in FIG. 1 represents identical components. Dewar 50 replaces the dewar 4 of FIG. 1. The dewar 50 has the overall shape and configuration as illustrated in FIG. 3, i.e. somewhat trapezoidal or truncated triangular shape. In FIGS. 2 and 3, the dewar 50 has an outer housing 49 comprising a trapezoidal bottom wall 52 and two identical pentagon shaped side walls 54 and 56. A rectangular rear wall 58 is preferably welded to the bottom wall 52 and the two side walls 54 ad 56. A rectangular front leg wall 59 depends from and welded to bottom wall 52. A trapezoidal bottom wall portion 60 is welded to and extends forward of the lower edge of front leg wall 59. Side walls 54 and 56 have respective depending portions 62 and 64 welded to the bottom wall portion 60. A rectangular wall of shorter length and narrower width than rear wall 58 is welded to the forward edges of side walls 54 and 56 including the regions forward of the front leg wall 59. Wall 59 and portions 62 and 64 form a pocket 68 depending below the plane of wall 52. The front wall 66 upper edge is significantly lower than the upper edge of rear wall 58 extending from the plane of the bottom wall 52. The walls 54 and 56 are spaced further apart at wall 58 as compared to wall 66 which is narrower than wall 58 to provide a tapered volume that increases in width rearwardly. Two like planar rib members 70 and 72 are welded coplanar with the side walls 56 and 54 respectively. The rib members 70 and 72 reinforces the outer housing 49. The rib members 70 and 72 receive electronic circuitry therebetween via circuit board 88 for operating the cold finger releasable assembly 6. A cold finger securing flange 76 is secured to the warm cap flange 16 at the front wall 66 lower region thereof adjacent to the bottom wall portion 60.

A trapezoidal first top wall member 78 is welded, for example, to the upper edges of front wall 66 and upper edges of side walls 54 and 56. A second top wall member 80 covers the remaining upper region between and is welded to side walls 54, 56, rear wall 58 and an edge of top wall member 78 extending between side walls 54 and 56. The relationship of certain of these walls can be seen in more detail in FIG. 2. The resulting volume tapers toward the rear into a wider structure. In the alternative, the bottom wall 52 and the top wall members may be rectangular to form a shape such that the rear portion of the dewar has the same width into the drawing as compared to the front portion. Flange 76 and front wall 66 have an opening 82 for receiving the cold finger assembly 6. The wall 59 includes an aperture 84 for receiving a feedthrough connector 86 (FIG. 2) for connecting wiring 85, 85' to the electronics of circuit board 88 secured to the rib members 74 and 72. Cold finger tube 14 has a portion 14' which extends into the pocket 68 of the housing 49 formed by wall 59 and portions 62 and 64 of the side walls.

In FIG. 2, the liquid nitrogen containing vessel 90 is of similar shape as the dewar 50 housing 49 and is nested therein in spaced relationship to form a chamber 92 between the vessel 90 and the housing 49. The vessel 90 is a pentagon in side view to match the general shape of housing 49. The vessel 90 comprises a bottom wall 94, a rear wall 96, a front wall 98 and two top walls 100 and 102 which are attached to identical pentagon shaped side walls 104 (only one of which is shown in FIG. 2. Bottom wall 94 is planar and parallel to housing bottom wall 52 but extends forward over and substantially encloses pocket 68 at the upper side thereof. The front wall 98 is parallel to the housing 49 front wall 66 and the vessel rear wall 96 is parallel to the housing 49 rear wall 58. The top wall 102 is parallel but spaced a considerably greater distance than the other walls from the top wall member 80 of the housing 49. The top wall 100 is spaced from the top wall portion 78 a relatively close spacing to the facing housing 49 walls as is the other walls as shown notwithstanding the pocket 68. Vessel 90 top wall 102 has an opening 103 as does top wall member 80. Secured within openings 103 is a fiberglass tube 106. The tube 106 is glued to top wall portion 80 and to top wall 102 of the vessel 90 to provide the primary support structure for the vessel 90 to the housing 49. The tube 106 is bonded to the housing wall portion 80 and vessel wall 102 by a suitable adhesive, for example, epoxy. The smallest gaps between the housing 49 and vessel 90 walls, for example, between wall 100 and top wall member 78, the rear walls 58, 96, front walls 66 and 98 and bottom walls 52 and 94 are typically about 0.4 inches (10 millimeters). A multilayer Mylar insulating blanket 105 covers the vessel 90 in conventional fashion. In the embodiment described, the vessel 90 contains about 2.3 liters of liquid nitrogen. The fiberglass tube 106 has sufficient strength to hold the liquid filled vessel 90. Tests have shown that a vessel 90 containing as much as 10 liters of liquid nitrogen can be secured solely by the fiberglass tube 106. The tube 106 serves as a filler port for the liquid nitrogen into the cavity of vessel 90.

A plug 110 is inserted in the cavity of tube 106 to seal the tube once liquid nitrogen is filled in the vessel 90. The plug 110 comprises a metal cap 112 and a styrofoam thermoplastic stem 114. The cap and stem include a conduit 116 for venting the vessel 90 interior as the nitrogen boils off during use. The walls of the vessel 90 and that of the housing are preferably aluminum and may generally be about 0.18 inches (about 5 millimeters) thick and comprise 6061 T4 aluminum. All of the side walls of the housing and vessel are flat aluminum plates which are preferably welded at their abutting edges. Other fabrication techniques, such as stamping, may be used, if desired.

An aluminum copper lug 118 is welded to the bottom wall 94 of vessel 90 at the forward part above the pocket 68. The lug 118 has a threaded aperture for receiving a threaded stud 120 for securing one end of a copper braided strap 122. The other end of the strap 122 is connected, for example, by soldering, via a lug to cold finger tube portion 14' inside pocket 68. The strap 122 has a length sufficient to form an s-shape as shown to allow for contraction and expansion of the vessel 90 and the outer housing of the dewar 50 in response to temperature cycling in the presence and absence of liquid nitrogen. The s-shaped configuration of the strap 122 is advantageous in that a major portion of the surfaces of the strap face each other minimizing heat inputs which would contribute to heat gain of the system. Only one side of the strap along only a portion of a length of the strap is exposed to radiation in the ambient atmosphere of pocket 68. The length of the strap 122 is relatively short as compared to the prior art strap described above in connection with FIG. 1.

In operation, liquid nitrogen is filled into the cavity of vessel 90 through the fill tube 106. The plug 110 then closes the tube. Regardless of whether the vessel 90 is horizontal with the bottom wall 94 plane parallel to the horizontal normal to the direction of the force of gravity or at an angle $\alpha$ in the range of 0° to 60° in accordance with a given implementation, liquid nitrogen always fills the front portion of the vessel 90 adjacent to the intersection of front wall 98 and the bottom wall 94. Therefore, there is always liquid nitrogen in contact with the bottom wall 94 at the region of lug 118 as the nitrogen boils off. The lug 118 is always maintained at the coldest temperature provided by the remaining liquid nitrogen 48. As the liquid nitrogen boils off and the dewar 50 is at an angle as shown, the lug 118 is maintained at its coldest temperature. The strap 122 is relatively short, for example, 2½ inches (about 65 millimeters) as compared to the strap 42 of the prior art system, FIG. 1, which may be about 7 inches (175 millimeters).

Pocket 68 as is all the intervening space between the vessel 90 and the housing formed by walls 52, 54, 56, 58, 66, 78, and 80 is evacuated in a known way via a nipple 124. The portion 14' of the cold finger tube 14 is closely spaced to the lug 118 providing efficient thermal coupling of the cold tube 14 to the liquid nitrogen 48. Further, by mounting the electronic circuit board 88 between the rib members 72 and 70 aligned with the pocket 68 and the elongated axis of the cold finger assembly 6, relatively few parts are added to the assembly comprising the dewar 50. No wedge is required because of the truncated triangular or pentagon shape of the dewar 50 which is capable of being oriented anywhere in the range of the entry aperture angle $\alpha$ without interference with protruding microscope portions such as portion 40. Thus a universal dewar is provided which is useful with microscopes of different entry angles. Further, by standardizing the size of the pocket 68 and the enclosing walls and making the dewar vessel 90 of different volumes, different dewar capacities can be attached to the slide mechanism 20 and for receiving cold finger assembly 6 for attachment to the microscopes of different configurations. Regardless the angle α of the dewar 50 orientation, liquid nitrogen 48 is always in contact with the bottom wall 94 adjacent to the cooling lug 118. Because of the minimum heat gain due to the closeness of the cold finger tube portion 14' to the lug 118, the liquid nitrogen does not boil off as rapidly as prior art systems and therefore is less costly to operate.

While the shape of the dewar has been shown somewhat boxy in configuration, it could also be configured as a conical structure in which the flange 76 in FIG. 3 is secured to a truncated frontal portion of a cone formed by the dewar assembly. In this case the side walls would be merged into one conical wall for the vessel and a second wall for the housing. Other shapes may be adapted to the vessel and housing in accordance with a given implementation to provide a universal dewar structure.

What is claimed is:

1. A dewar construction for cooling a radiation detector cold finger of a cold finger assembly for use with an electron microscope, said dewar comprising:
    a housing;
    a vessel secured thermally insulated from and within the housing for receiving liquid nitrogen for cooling said cold finger, said vessel being spaced from the housing to form a chamber therebetween, said chamber maintaining a vacuum;
    means for releasably securing said cold finger assembly to said housing in a given fixed orientation relative to said vessel with a portion of the secured cold finger extending into said chamber adjacent to said vessel; and
    means secured to said vessel in a given vessel region for thermally conductive coupling to said received cold finger, said means for conductive coupling being so positioned such that liquid nitrogen in said vessel is in thermal contact with the vessel at said region regardless the orientation of the vessel relative to gravity when said cold finger is coupled to said microscope.

2. The dewar construction of claim 1 including electrical circuitry for operating said cold finger, said housing including means for receiving said electrical circuitry adjacent to said means for releaseably securing said cold finger assembly and external said chamber.

3. The dewar construction of claim 1 wherein said dewar has a bottom wall lying in a plane and a top wall secured to the bottom wall by at least one side wall, said top wall tapering toward the plane of said bottom wall in the direction of said means for releasably securing.

4. The dewar construction of claim 1 wherein said chamber is generally defined by substantially parallel spaced walls of said housing and vessel, said walls being arranged to form an enlarged chamber portion for receiving said cold finger portion.

5. The dewar construction of claim 3 wherein said bottom wall lies in a plane, said housing including conduit means defining a conduit axis, said conduit means for receiving liquid nitrogen for filling said vessel, said axis extending non-normal to said plane.

6. The construction of claim 1 including displacement means secured to said housing and secured to said microscope for displacing said housing and cold finger assembly relative to said microscope.

7. The construction of claim 1 wherein said housing and vessel are substantially trapezoidal in vertical cross section.

8. The construction of claim 1 further including said cold finger portion secured to said vessel in said chamber.

9. The construction of claim 8 including a flexible thermal conductive strap thermally conductively connected to said vessel and to said cold finger.

10. The construction of claim 1 including a thermally insulating liquid nitrogen filling tube secured to said housing and to said vessel for securing said vessel in said spaced and thermally isolated relation relative to said housing and for receiving liquid nitrogen to be supplied into said vessel.

11. The construction of claim 1 wherein said housing is secured to said cold finger in fixed relative orientation, said housing being so shaped such as to be oriented at different angles relative to the horizontal corresponding to different cold finger entry angles relative to a corresponding microscope without interference between said housing and said microscope.

12. A dewar construction for cooling a radiation detector cold finger of a cold finger assembly for use with an electron microscope, said dewar comprising:
    a housing;
    a vessel secured thermally insulated from and within the housing for receiving liquid nitrogen for cooling said cold finger, said vessel being spaced from the housing to form a chamber therebetween, said chamber maintaining a vacuum;
    a cold finger for cooling a received radiation detector, said finger being releasably secured to said housing in a given fixed orientation relative to said vessel with a portion of the cold finger extending into said chamber adjacent to said vessel; and
    said housing is secured to said cold finger in fixed relative orientation, said housing being so shaped such as to be oriented at different angles relative to the horizontal corresponding to different cold finger entry angles relative to a corresponding microscope without interference between said housing and said microscope.

13. The construction of claim 12 including a thermally conductive flexible strap thermally conductively connected to said vessel and to said cold finger for cooling the cold finger.

14. The construction of claim 13 including means coupled to said housing for securing said housing and cold finger assembly to said microscope.

15. A dewar construction for cooling a radiation detector cold finger in a cold finger assembly for use with a plurality of electron microscopes of different external configurations exhibiting different entrance aperture angles of said cold finger relative to the horizontal normal to the force of gravity, said dewar comprising:
    a housing;
    a vessel secured thermally insulated from and within the housing for receiving liquid nitrogen for cooling said cold finger, said vessel being spaced from the housing to form a chamber therebetween, said chamber maintaining a vacuum;
    means for securing said cold finger assembly to said housing in a given fixed orientation relative to said vessel such that the orientation of the vessel and cold finger relative to the horizontal is determined by said entrance aperture angle; and
    means for receiving a thermally conductive cold finger cooling conductor secured thermally conductive to said vessel at a region of said vessel in said chamber such that said received liquid nitrogen is substantially in thermal conductive relation with said region regardless of the orientation of said housing and vessel with respect to the horizontal.

16. The construction of claim 15 wherein said housing has a pair of spaced side walls and spaced front and rear walls all upstanding from a bottom wall and a top wall secured to said side, front and rear walls spaced form the bottom wall, said side walls having an approximate triangular shape with a truncated apex, said apex of the triangular shape adjacent to said means for securing said cold finger.

17. The construction of claim 15 wherein said means for securing the cold finger includes means for securing a portion of the cold finger in the chamber.

18. The construction of claim 15 including said cooling conductor, said cooling conductor comprising an S shaped flexible thermally conductive strap connected at one end to said vessel and at its other end to said cold finger.

19. The construction of claim 16 including said cold finger and a radiation detector secured to said cold finger for generating an electrical signal, said construction including electrical circuit means for processing said electrical signal secured to said bottom wall external said housing approximately aligned with said cold finger in a direction along said bottom wall.

20. The construction of claim 19 wherein said chamber has an enlarged portion for receiving a portion of said cold finger, said enlarged portion being between said electrical circuit means and said cold finger portion.

21. A dewar construction for cooling a radiation detector secured to an end of a cold finger for detecting radiation in an electron microscope secured thereto via a microscope cold finger entrance port, said port in different microscopes having different cold finger entrance angles relative to the force of gravity, said construction comprising:

a dewar for receiving liquid nitrogen and including means for securing a cold finger thereto in fixed and thermal conductive relation for cooling the cold finger to a cryogenic temperature; and means for securing said dewar and cold finger to any selected one of said microscopes with said cold finger at any of said entrance angles, said dewar being dimensioned such that said dewar and cold finger attached thereto are dimensioned to be secured to said selected microscope without interference of said dewar with said selected microscope and without the use of intermediate connecting elements such that the dewar assumes different orientations relative to the force of gravity corresponding to the entrance angle of the selected microscope.

22. The construction of claim 21 wherein said dewar has an inner liquid nitrogen containing vessel within and spaced from an outer housing forming an insulating evacuated cavity therebetween, said dewar including means for receiving a portion of said cold finger within said cavity and means for thermally conductively connecting said cold finger portion to said vessel.

* * * * *